(12) United States Patent
Xia et al.

(10) Patent No.: US 10,186,660 B2
(45) Date of Patent: Jan. 22, 2019

(54) MEMRISTOR DEVICE

(71) Applicant: University of Massachusetts, Boston, MA (US)

(72) Inventors: Qiangfei Xia, Amherst, MA (US); Hao Jiang, Sunderland, MA (US); Jianhua Yang, Hadley, MA (US)

(73) Assignee: University of Massachusetts, Boston, MA (US)

( * ) Notice: Subject to any disclaimer, the term of this patent is extended or adjusted under 35 U.S.C. 154(b) by 0 days.

(21) Appl. No.: 15/471,878

(22) Filed: Mar. 28, 2017

(65) Prior Publication Data

US 2018/0287058 A1  Oct. 4, 2018

(51) Int. Cl.
*H01L 45/00* (2006.01)
*H01L 27/24* (2006.01)
*G11C 13/00* (2006.01)

(52) U.S. Cl.
CPC ........ *H01L 45/146* (2013.01); *G11C 13/0069* (2013.01); *G11C 13/0097* (2013.01); *H01L 27/2463* (2013.01); *H01L 45/1233* (2013.01); *H01L 45/1253* (2013.01)

(58) Field of Classification Search
CPC ............... H01L 45/146; H01L 45/1233; H01L 45/1253; H01L 45/08; H01L 45/085; H01L 45/1266
See application file for complete search history.

(56) References Cited

U.S. PATENT DOCUMENTS

| 8,686,389 B1* | 4/2014 | Wang | H01L 45/145 257/2 |
| 2012/0319071 A1* | 12/2012 | Awaya | G11C 13/0007 257/4 |
| 2014/0091271 A1* | 4/2014 | Tu | H01L 45/08 257/4 |

OTHER PUBLICATIONS

Chen, Yang Yin et al., "Endurance/Retention Trade-off on HfO₂/Metal Cap 1T1R Bipolar RRAM", IEEE Transactions on Electron Devices, vol. 60:1114-1121 (2013).
(Continued)

*Primary Examiner* — Allison Bernstein
(74) *Attorney, Agent, or Firm* — Fish & Richardson P.C.

(57) ABSTRACT

A resistance switching device is disclosed and is fabricated to create a memristor device. The memristor device includes a substrate and a platinum bottom electrode formed on the substrate. A tantalum top electrode is formed opposite the bottom electrode, and an electrical insulator layer is disposed between the top electrode and the bottom electrode, wherein the electrical insulator layer comprises hafnium oxide. In an alternate implementation, a titanium nitride layer is deposited on the substrate, which then allows a reduced thickness platinum bottom electrode layer to be deposited on the titanium nitride layer.

27 Claims, 7 Drawing Sheets

(56) References Cited

OTHER PUBLICATIONS

Ge, Ning et al., "Electrode-material dependent switching in TaOx memristors", Semiconductor Science and Technology, vol. 29:104003 (2014).
Wedig, Anja et al., "Nanoscale cation motion in $TaO_x$, $HfO_x$, and $TiO_x$ memristive systems", Nature Nanotechnology Articles (Sep. 28, 2015), 9 pages.
Wedig, Anja et al., "Nanoscale cation motion in $TaO_x$, $HfO_x$ and $TiO_x$ memristive systems", Nature Nanotechnology Supplementary Information (2015), 13 pages.
Yang, Joshua J. et al., "Memristive devices for computing", Nature Nanotechnology, vol. 8:13-24 (2013).

* cited by examiner

MEMRISTOR DEVICE

GOVERNMENT FUNDING

This invention was made with government support under Grant No. FA9550-12-1-0038 awarded by the U.S. Air Force Office for Scientific Research (AFOSR) and with government support under Grant No. FA8750-15-2-0044 awarded by the U.S. Air Force Research Laboratory (AFRL). The government has certain rights in the invention.

TECHNICAL FIELD

This application relates to resistance switching devices, also known as memristors.

BACKGROUND

Resistance switching devices, also called memrisitive devices, have attracted extensive interest for applications including non-volatile memory, reconfigurable switches, bio-inspired neuromorphic computing and radiofrequency switches. While typically fabricated from relatively simple metal/insulator/metal (MIM) structures, memristive devices have shown highly desirable properties including low power consumption, fast switching speed, and great cycling ability. To date, a wide variety of material systems have been developed for memristive devices that work under different mechanisms. For electrochemical metallization memory (ECM) systems, it has been observed that formation and dissolution of metallic filaments (e.g., copper—Cu or silver—Ag) are responsible for the low and high resistance states. On the other hand, for valence change memory (VCM) type of systems such as $Pt/TiO_2/Pt/Ti$ and $Ta/TaO_x/Pt$, it is widely accepted that the motion of oxygen anions (or equivalently the positive-charged oxygen vacancies) leads to valence changes of the metal (cations) and hence the resistance changes of the metal oxide materials. These devices can also form a conduction channel between the two metal layers of the MIM structure. The conduction channel can be a newly formed conductive crystalline sub-oxide phase such as $Ti_4O_7$ in $TiO_2$ based devices, or an amorphous metal-oxygen solid solution such as Ta(O) in $TaO_x$ systems. Recently, based on scanning tunneling microscopy (STM) studies it was proposed that the migration of cations, in addition to oxygen anions, could also contribute to the resistive switching behavior in typical VCM materials such as $TaO_x$, $TiO_x$ and $HfO_x$. However, direct visual observations of conduction channels induced by cations migration inside the switching oxides and a physical model concerning the roles of both cations and anions during the resistance switching in VCM-type devices have not been revealed prior to the work described herein.

SUMMARY

In one implementation, a $Ta/HfO_2/Pt$ (tantalum, hafnium oxide, platinum) memristor device is described. The memristor device has low programming voltage, fast switching speed (≤5 ns), very high endurance ($1.2\times10^{11}$ cycles), and reliable retention (extrapolated to be >>10 years at 85° C.). The device is capable of being programmed to multiple resistance levels with long retention by controlling the compliance currents (CCs). Experiments performed using the prototype memristor device successfully demonstrated that the device could be programmed to 24 or more discrete resistance levels, with 32 or even 64 or more resistance levels being possible. The device achieves over a million ($2^{20}$) potentiation and depression epochs using electrical pulse trains. Using scanning transmission electron microscopy (STEM) and electron energy loss spectroscopy (EELS), it was directly identified that the memristor device includes a tantalum rich and oxygen deficient conduction channel that develops between the tantalum top electrode and the platinum bottom electrode, and through the hafnium oxide insulator layer, that connects the top and bottom electrodes. This conduction channel is responsible for the resistance switching feature associated with the memristor device. The switching behavior of the memristor device is attributed to the composition modulation of a sub-10 nm conduction channel implemented through the motion of both cations and anions in the hafnium oxide layer driven by electric field and thermal effect.

According to one innovative aspect of the subject matter described in this application, a memristor device includes a substrate and a platinum bottom electrode formed on the substrate. A tantalum top electrode is formed opposite the bottom electrode, and an electrical insulator layer is disposed between the top electrode and the bottom electrode, wherein the electrical insulator layer comprises hafnium oxide.

The memristor device may include one or more of the following optional features. The application of a voltage to the tantalum top electrode causes the formation of a conduction channel between the tantalum top electrode and the platinum bottom electrode, and through the hafnium oxide insulator layer. The conduction channel that forms upon the application of the voltage may be tantalum rich and oxygen deficient.

The memristor device may be settable at multiple discrete resistance levels. The multiple discrete resistance levels may include a range of 2 to 64 discrete resistance levels. The multiple discrete resistance levels may be set using a current biasing circuit connected to the memristor device. The current biasing circuit may include a transistor circuit connected to the memristor device.

The platinum bottom electrode may be formed to have a thickness of 20 nanometers. The platinum bottom electrode may also be formed to have a thickness in the range of 2 to 200 nanometers. The tantalum top electrode may be formed to have a thickness of 50 nanometers. The tantalum top electrode also may be formed to have a thickness in the range of 2 to 200 nanometers. The electrical insulator layer may be formed to have a thickness of 5 nanometers. The electrical insulator layer also may be formed to have a thickness in the range of 2 to 20 nanometers. The memristor device may further include an oxide layer formed on a top surface of the substrate, and a titanium layer formed on the oxide layer, wherein the platinum bottom electrode is formed on the titanium layer. The oxide layer may be silicon oxide.

According to another innovative aspect of the subject matter described in this application, a memristor device includes a substrate, and a bottom electrode formed on the substrate. A tantalum top electrode is formed opposite the bottom electrode. An electrical insulator layer is disposed between the top electrode and the bottom electrode, wherein the electrical insulator layer comprises hafnium oxide.

The memristor device may include one or more of the following optional features. The bottom electrode may further comprise a platinum (Pt) layer. A titanium nitride (TiN) layer may be formed on the substrate and the bottom electrode may further comprise a platinum (Pt) layer formed on the titanium nitride (TiN) layer. An adhesion layer may be formed on the substrate, and the bottom electrode may further comprise a platinum (Pt) layer formed on the adhesion layer. The platinum layer may be formed to have a thickness of 1-4 nanometers. The titanium nitride layer may be formed to have a thickness of 20 nanometers.

According to another innovative aspect of the subject matter described in this application, a memristor device includes a substrate, and a silicon oxide layer formed on the substrate. A metal adhesion layer is formed on the silicon oxide layer. The metal adhesion layer includes one of a titanium adhesion layer and a titanium nitride adhesion layer. A platinum bottom electrode is formed on the metal adhesion layer. The platinum bottom electrode is formed to have a thickness in the range of 2 to 200 nanometers. An electrical insulator layer is formed on the platinum bottom electrode. The electrical insulator layer comprises hafnium oxide and is formed to have a thickness of 5 nanometers. A tantalum top electrode is formed on the electrical insulator layer. The tantalum top electrode is formed to have a thickness of 50 nanometers.

The memristor device may include the following optional features. For example, application of a voltage to the tantalum top electrode may cause the formation of a conduction channel between the tantalum top electrode and the platinum bottom electrode, and through the hafnium oxide insulator layer. The conduction channel that forms upon the application of the voltage may be tantalum rich and oxygen deficient.

The details of one or more implementations of the subject matter described in this specification are set forth in the accompanying drawings and the description below. A particular advantage of the memristor device is that the combination of the tantalum top electrode and hafnium oxide switching layer produces a memristor device with superior electrical performance characteristics. Another advantage is that the disclosed design of the memristor device allows for a high level of scalability to produce more complex semiconductor based circuits, systems and devices. Other features, aspects, and advantages of the subject matter will become apparent from the description, the drawings, and the claims.

DETAILED DESCRIPTION

Figure 1A:
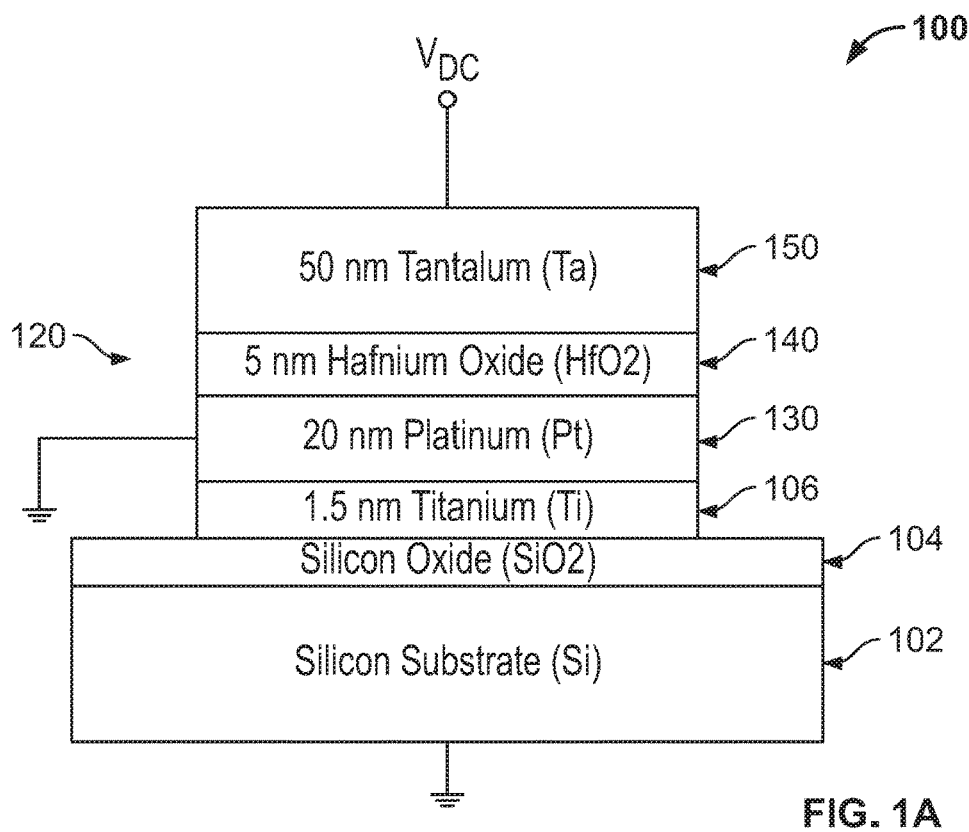
FIG. 1A illustrates a schematic diagram of the various fabricated layers of one implementation of a memristor device.

FIG. 1A illustrates a schematic diagram of an example circuit device 100 fabricated on a substrate 102 forming a Ta/HfO$_2$/Pt (tantalum, hafnium oxide, platinum) memristor device 120. It should be noted that the schematic representation showing the various layers of memristor device 120 is not drawn to scale. The example structure in FIG. 1A shows the memristor device 120 fabricated on a semiconductor substrate 102 which is preferably a silicon (Si) wafer. An oxide layer, such as silicon oxide layer 104, is formed on the substrate 102. The circuit device 100 also includes a thin titanium layer 106 deposited on the surface of the silicon oxide layer 104 to create an adhesion surface for the platinum layer. The memristor device 120 includes a platinum (Pt) layer 130 that creates a bottom electrode, a hafnium oxide (HfO$_2$) layer 140 that creates an insulating layer, and a tantalum (Ta) layer 150 that creates a top electrode. The tantalum layer 150 formed as a top electrode is critical to the operation of the memristor device 120.

In one implementation shown in FIG. 1A, the titanium layer 106 is fabricated to a thickness of approximately 1.5 nm, the platinum layer 130 is fabricated to a thickness of approximately 20 nm, the hafnium oxide layer 140 is fabricated to a thickness of approximately 5 nm, and the tantalum layer 150 is fabricated to a thickness of approximately 50 nm. Variations on the thickness of each layer are also within the scope of the present invention. For example, while the preferred thickness of the platinum layer 130 is approximately 20 nm, the thickness of the platinum layer 130 may be fabricated to range between 2 nm and 200 nm and still produce superior technical performance. While the preferred thickness of the hafnium oxide layer 140 is approximately 5 nm, the thickness of the hafnium oxide layer 140 may be fabricated to range between 2 nm and 20 nm and still produce superior technical performance. Additionally, while the preferred thickness of the tantalum layer 150 is approximately 50 nm, the thickness of the tantalum layer 150 may be fabricated to range between 2 nm and 200 nm and still produce superior technical performance. In some applications that benefit from a top electrode having lower resistance properties, the thickness of the tantalum top electrode layer 150 may be fabricated up to a thickness of 500 nm or more.

Figure 1B:
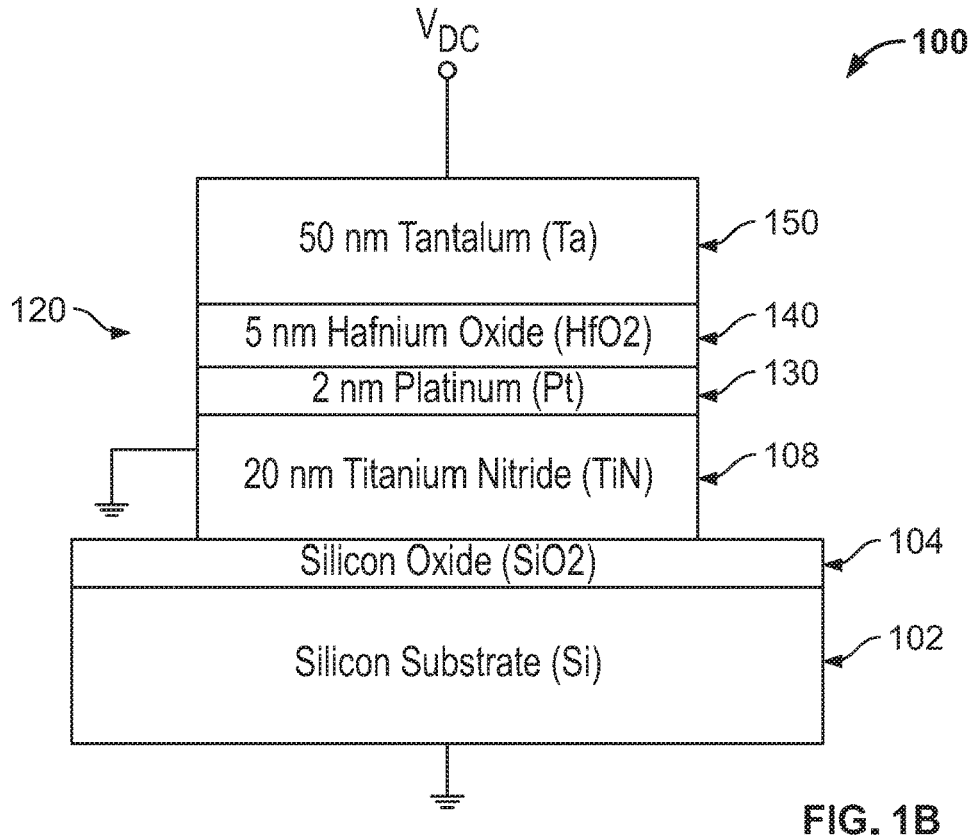
FIG. 1B illustrates a schematic diagram of the various fabricated layers of an alternate implementation of a memristor device.

In a related alternate implementation shown in FIG. 1B, a thicker titanium nitride (TiN) layer 108 is formed on the silicon oxide layer 104, which then allows for a thinner platinum layer to be fabricated as the bottom electrode. The titanium nitride layer 108 also provides a foundation layer for the thinner platinum bottom electrode. The titanium nitride layer 108 is preferably fabricated to a thickness of approximately 20 nm. However, it should be understood that the titanium nitride layer 108 may be fabricated to range between 10 nm and 200 nm. The platinum layer 130 is then fabricated on the top surface of the titanium nitride layer 108. The hafnium oxide layer 140 and tantalum layer 150 are then fabricated on the platinum layer 130 as described above with reference to FIG. 1A. The platinum layer 130 in this alternate implementation is fabricated to a preferred thickness of approximately 2 nm, and may be fabricated to range between 1 nm and 4 nm. The use of a thinner platinum layer 130 reduces the amount of platinum required to fabricate the memristor device 120, which in turn provides a substantial reduction in the platinum material cost. The thinner platinum layer 130 also isolates the titanium nitride from the hafnium oxide layer 140, potentially avoiding any interfacial chemical reaction that could lead to performance degradation of the memristor device 120. It is also possible to use Ruthenium as an alternate replacement for the thinner platinum layer 130.

The design of memristor device 120 allows the device to be manufactured using available CMOS materials and existing fabrication techniques. The substrate 102 used for fabricating the device is a silicon wafer. In one implementation an oxide layer 104 is them formed on the surface of the substrate 102. The oxide layer 104 is preferably a 100 nm layer of silicon oxide ($SiO_2$) that is thermally grown on top of the silicon wafer to complete the substrate 102. For the 10×10 $\mu m^2$ micro-devices, the bottom electrodes (130) are patterned by ultraviolet photolithography. After that, a 1.5 nm titanium (Ti) layer 106 is deposited on the surface of the oxide layer 104 using an electron beam evaporator process. The titanium layer 106 primarily operates as an adhesion layer for the (platinum) bottom electrode. In a next sequential step, a 20 nm platinum layer 130 is deposited on the top surface of the titanium layer 106 using an electron beam evaporator process, followed by a lift-off process in acetone. The 5 nm hafnium oxide blanket layer 140 is fabricated on the surface of the platinum layer 130 through an atomic layer deposition (ALD) process using water and tetrakis(dimethylamido)hafnium as precursors at 250° C. Other fabrication and deposition techniques are also possible. The use of the atomic layer deposition process produces a higher yield. The 50 nm thick tantalum layer 150, which also creates a top electrode, is fabricated using a second photolithography step and a fifteen second $O_2$ descum, metallization using DC sputtering and liftoff.

Figure 2A:
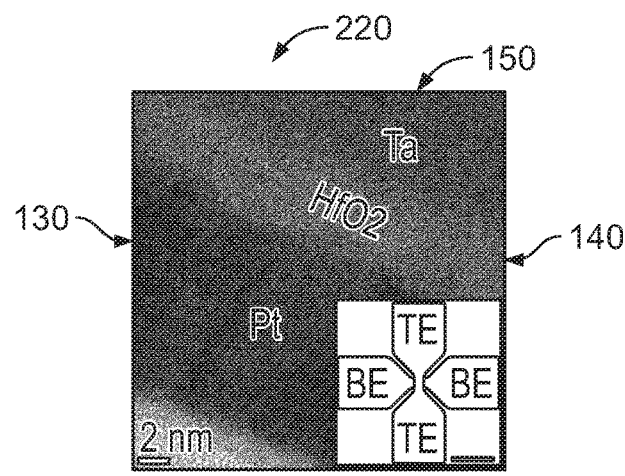
FIGS. 2A-F illustrate graphical data showing the electrical performance of an exemplary memristor device.
Figure 2B:
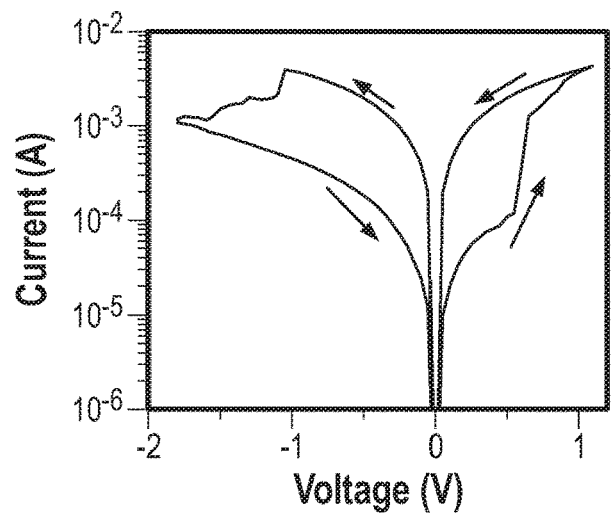
Figure 2C:
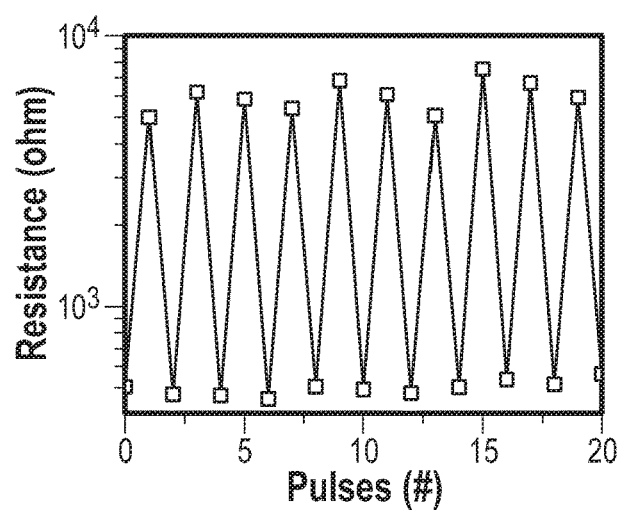
Figure 2D:
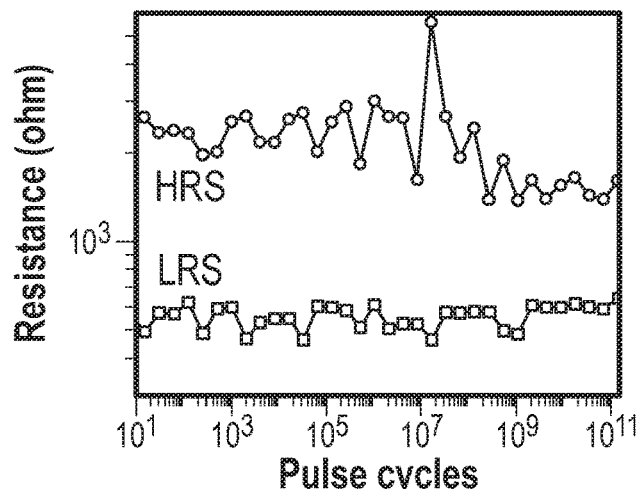
Figure 2E:
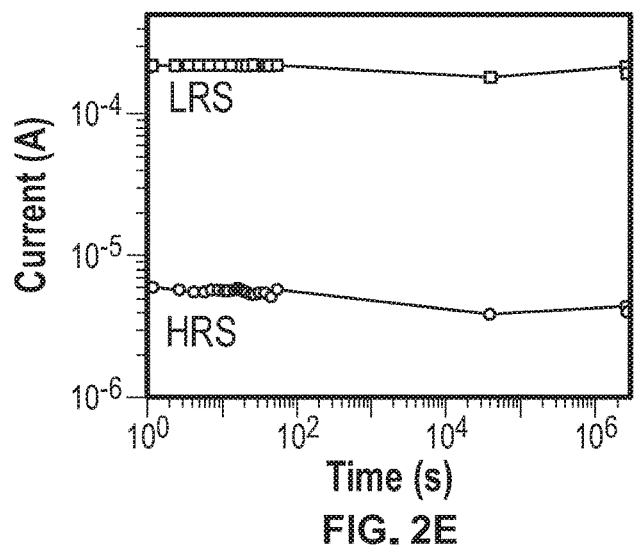
Figure 2F:
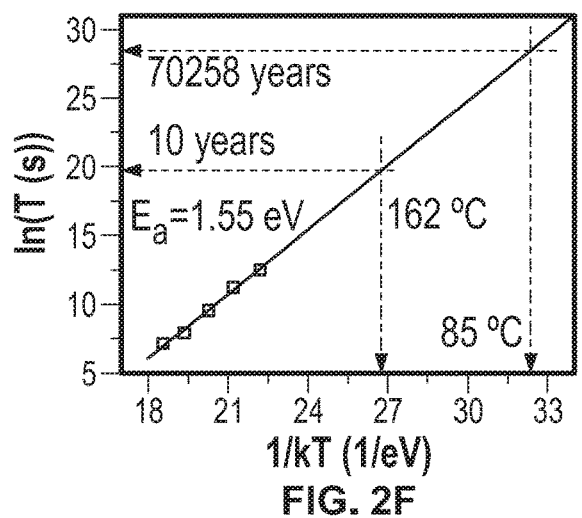

FIG. 2A shows a transmission electron microscopy (TEM) cross-section view 220 of the tantalum, hafnium oxide, platinum ($Ta/HfO_2/Pt$) memristor device. The inset of FIG. 2A shows an optical top-view image of the memristor device 120 (scale bar: 50 $\mu m$) fabricated as a cross point structure on the substrate 102. During all of the measurements, the top tantalum electrodes 150 were biased while the bottom platinum electrodes 130 were grounded. FIG. 2B shows a typical I-V curve from the 10 by 10 $\mu m^2$ memristor device 120 fabricated as a cross point device showing the resistive switching behavior. The black arrows indicate the switching directions. After the forming process, the memristor device 120 stays in the ON state. The memristor device can then be reset with a negative voltage sweep, and then set with a positive voltage sweep. FIG. 2C shows the memristor device 120 can be repeatedly switched between high resistance state (HRS) and low resistance state (LRS) with 5 ns pulses (SET: 2.2 V; RESET: −4 V) indicating faster than 5 ns switching speed. It should be noted that this switching speed measurement was limited by the pulse generator used during the testing process, and that a switching speed of faster than 5 ns could very likely be achieved and measured if a faster pulse generator were available at the time of testing. FIG. 2D is a graph showing that 120 billion switching cycles were demonstrated with pulses of 1.3 V/100 ns for SET and −3.05 V/100 ns for RESET. FIG. 2E is a graph of current vs. time for the LRS and HRS states that depicts the results of a retention test at room temperature that indicates no evident degradation after 1 month. FIG. 2F shows the results of retention time measured at 250, 275, 300, 325 and 350° C. The dotted red line is the Arrhenius fitting which yields an extrapolated activation energy 1.55 eV. The extrapolated retention time at 85° C. is 70258 years, and is 10 years at 162° C.

Figure 3A:
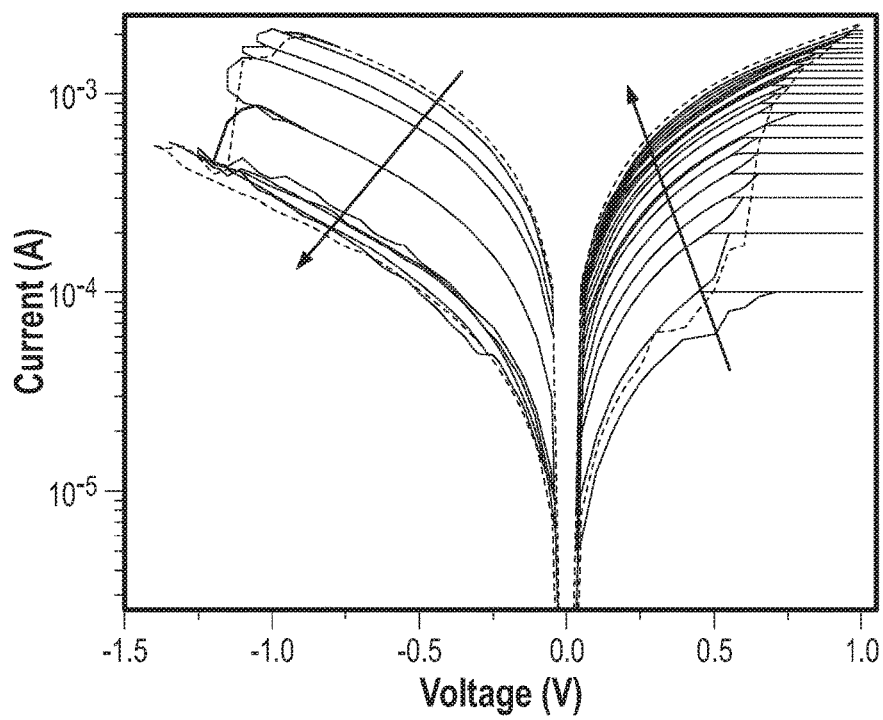
FIGS. 3A-D illustrate graphical data showing the multi-level non-volatile resistive switching behavior and reliable potentiation and depression performance of an exemplary memristor device.
Figure 3B:
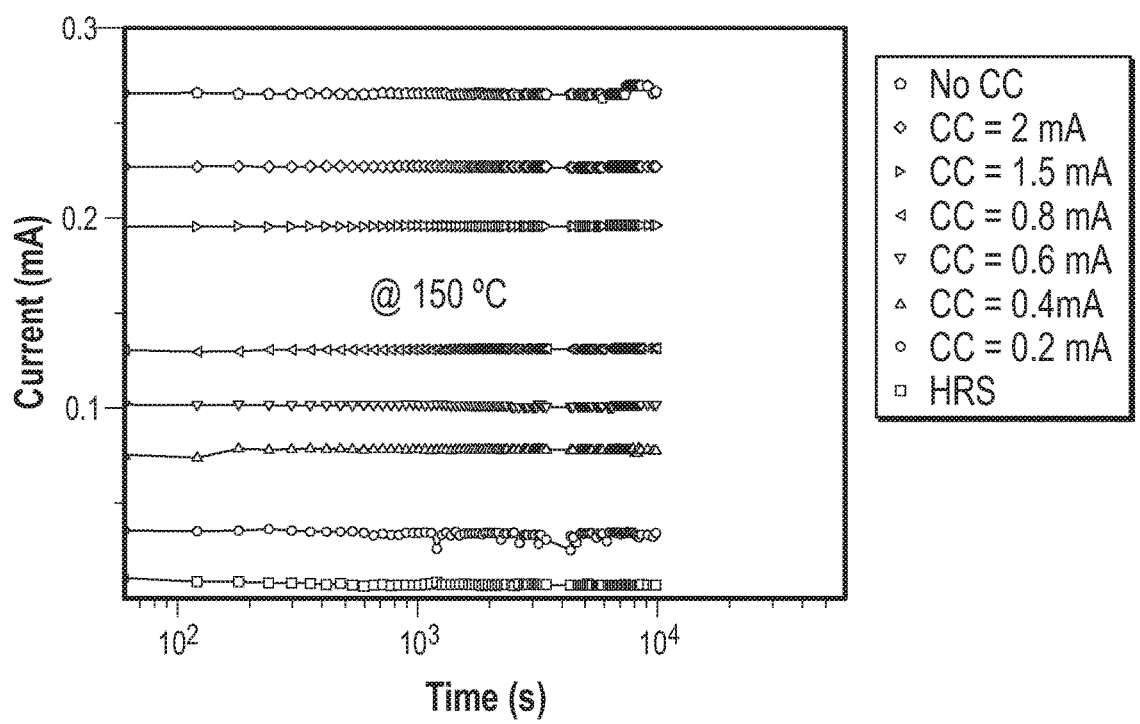
Figure 3C:
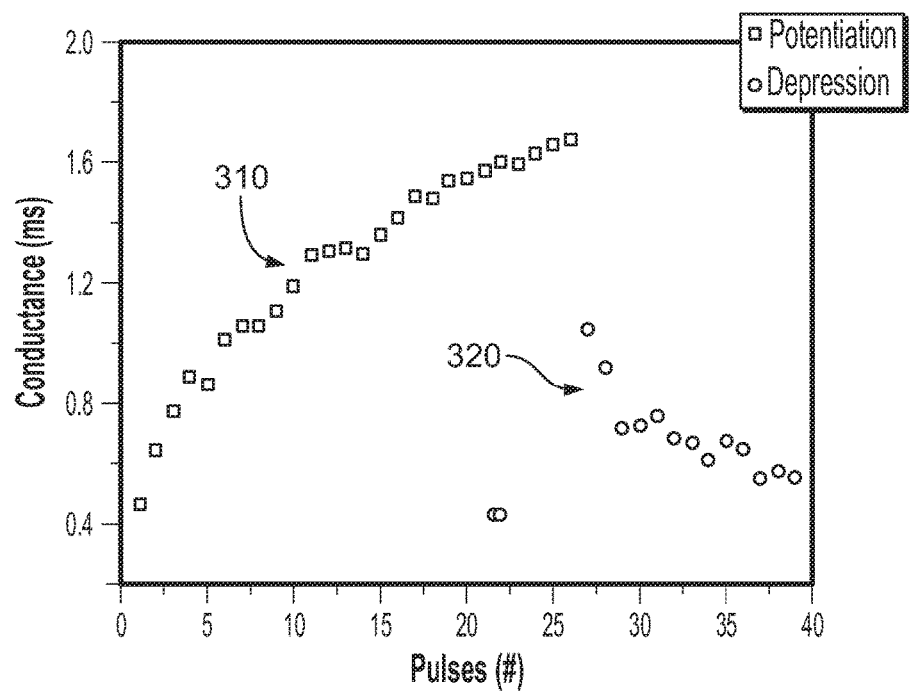
Figure 3D:
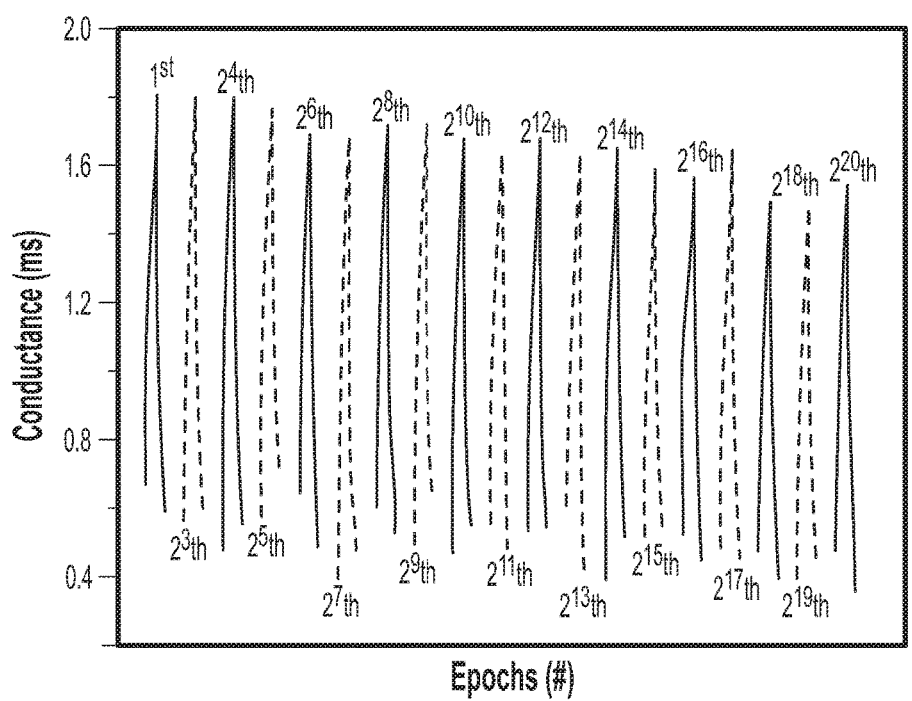

FIG. 3A is a graph of multiple I-V curves demonstrating that the memristor device 120 can be set by increasing the compliance current (CC) and that the memristor device 120 can be reset with negative voltage sweeps of increased amplitudes to different resistance levels. FIG. 3B shows the results of retention tests of 8 different CC levels at 150° C. ($>10^4$ s), confirming that the memristor device 120 demonstrates nonvolatile behavior and indicating the device is suitable for multi-level memory. FIG. 3C shows a typical analog switching cycle in which the conductance can be gradually increased with 26 positive pulses (100 ns, 0.75 to 1 V, 10 mV step) (potentiation 310), and gradually decreased with 13 negative pulses (100 ns, −1.05 to −1.17 V, 10 mV step) (depression 320). FIG. 3D is a graph that demonstrates $2^{20}$ potentiation/depression epochs, each consisting of 39 pulses, have been achieved. These testing results demonstrate that the memristor device 120 may be used as electronic synapse for neuromorphic computing applications.

Figure 4A:
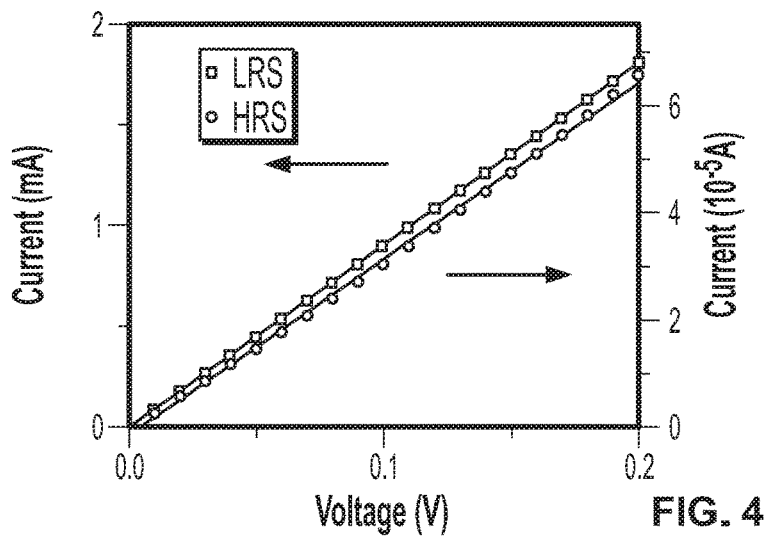
FIGS. 4A-4B illustrate graphical data showing the electrical conduction characteristics of the low resistance state (LRS) and high resistance state (HRS) of an exemplary memristor device.
Figure 4B:
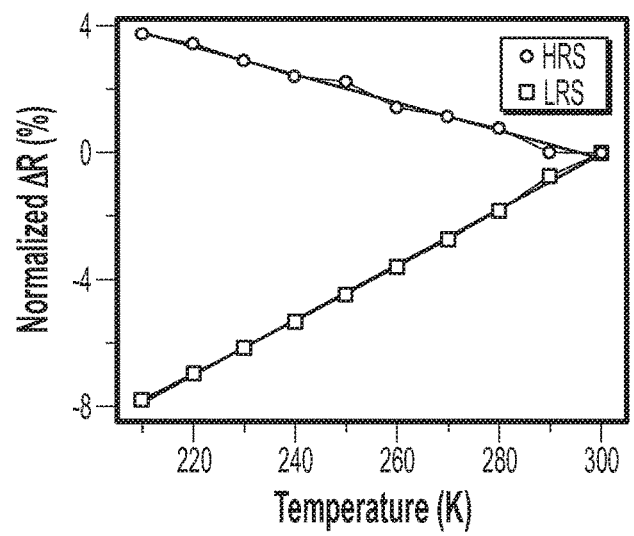

FIGS. 4A and 4B are graphs illustrating the electrical conduction mechanism of the low resistance state (LRS) and high resistance state (HRS) of an exemplary memristor device, such as memristor device 220 (FIG. 2A). In FIG. 4A, the linear fitting of the I-V curves for LRS and HRS indicates the absence of a tunneling gap between electrode and conduction channel(s) (e.g. conduction channel 510 of FIG. 5A). FIG. 4B shows the temperature dependence of the LRS and HRS resistances measured from the memristor device 220. The resistance change ($\Delta R$) is normalized by (R−R(300 K))/R(300 K). The LRS resistance decreases linearly, while the HRS resistance increases linearly with ambient temperature, indicating a transition of the conduction channel from metallic to non-metallic materials. The temperature coefficient of resistance (TCR) is measured to be $8.75 \times 10^{-4}$/K for LRS and $-4.37 \times 10^{-4}$/K for HRS. The switching should be attributed to the composition modulation of the conduction channel(s) (e.g. conduction channel 510 of FIG. 5A).

Figure 5A:
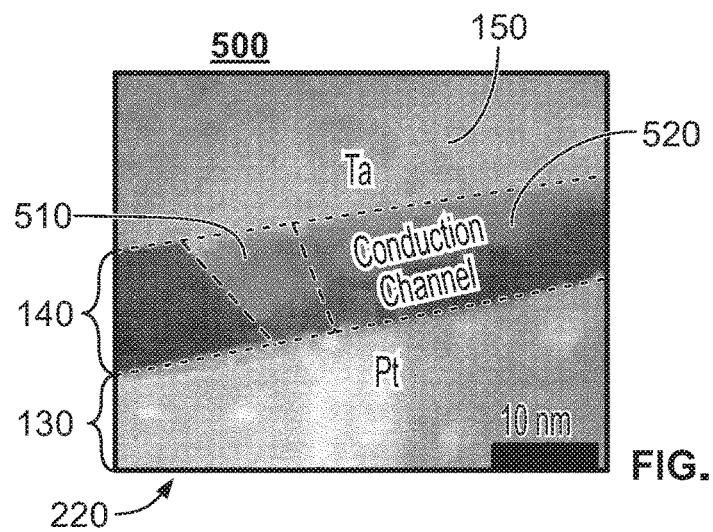
FIGS. 5A-5C illustrate an electron microscope image and physical analysis of an exemplary memristor device showing the conduction channel that forms between the tantalum top electrode and the platinum bottom electrode.
Figure 5B:
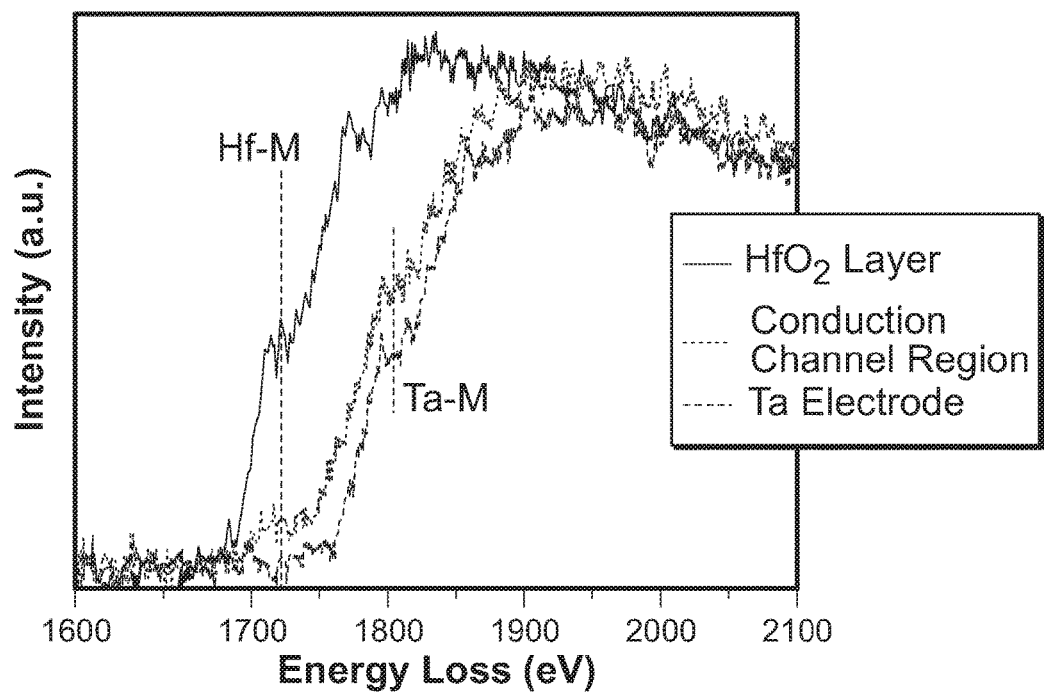
Figure 5C:
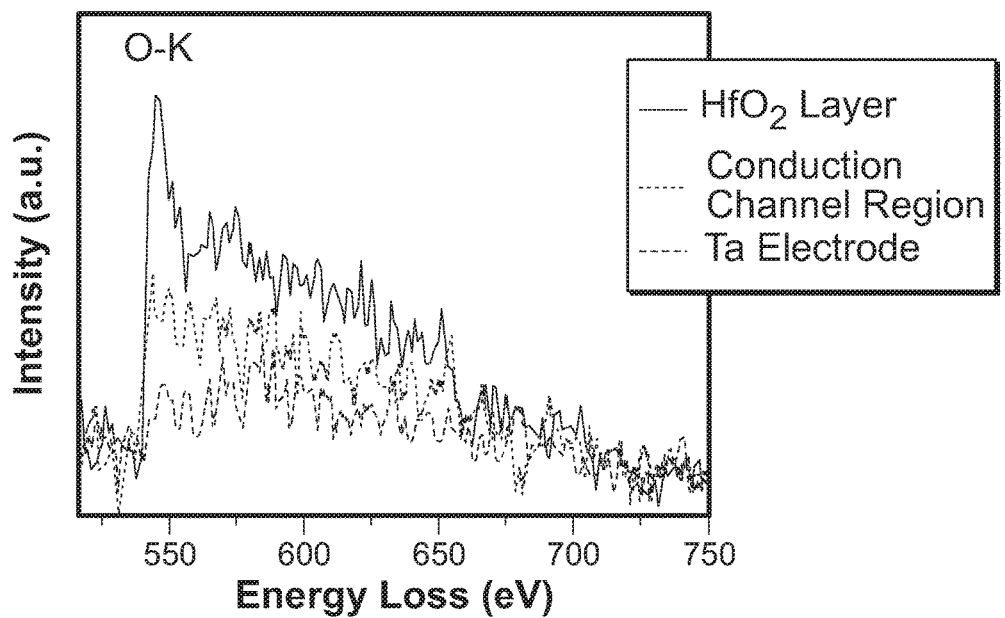

FIG. 5A illustrates a scanning transmission electron microscope (STEM) image 500 of the memristor device 220 (FIG. 2A) that was fabricated using the process described above. FIG. 5A shows the conduction channel 510 that forms within the hafnium oxide layer 140, and between the tantalum top electrode 150 and the platinum bottom electrode 130. More specifically, the STEM image 500 (HAADF-STEM image) shows a sub-10 nm conduction channel 510 connecting tantalum top electrode 150 and the platinum bottom electrode 130. The conduction channel 510 is the brighter area in the image 500, and is highlighted by two white dotted lines superimposed along the approximate channel boundaries. The brighter area indicates that the conduction channel 510 contains more atoms with large atomic numbers. In the case of the memristor device 120 this indicates that the conduction channel 510 contains more tantalum (Ta) atoms. The STEM image 500 in association with the data shown in FIGS. 5B and 5C provide a direct observation that the conduction channel 510 is rich with tantalum (Ta) and is also oxygen (O) deficient. The graph in FIG. 5B shows a comparison of core-loss electron energy loss spectroscopy (EELS) spectra collected at the pristine hafnium oxide layer 140, conduction channel region 510, and the tantalum top electrode 150, and further indicates that the conduction channel 510 is tantalum-rich. The graph in FIG. 5C illustrates O-K edge EELS spectra taken at three areas, which clearly shows the conduction channel 510 is also oxygen-deficient.

The memristor device described above was also tested to determine its electrical performance characteristics. With reference to FIG. 1A, the features of the fabricated memristor device 120 preferably include a 20 nm thick platinum bottom electrode 130, a 5 nm thick hafnium oxide layer 140, and a 50 nm thick tantalum top electrode 150. Hafnium oxide was chosen as the switching layer (140) because of its superior thermodynamic properties, and when used in combination with the tantalum layer 150, the resulting memristor device 120 produces superior electrical performance characteristics. FIG. 2A shows a cross sectional high-resolution TEM (HRTEM) image of the memristor device 120, which clearly shows both the top and bottom metal/oxide interfaces. The inset of FIG. 2A shows a top view optical image of the cross-point memristor device 120 that was fabricated for electrical performance testing. After electroforming at around 2.02 V, the 10×10 μm² memristor device 120 was brought to a low resistance state (LRS). As part of the electrical performance testing process, the device exhibited repeatable resistance switching behavior with a negative voltage sweep applied to the top electrode (150), resetting the memristor device 120 to a high resistance state (HRS), and a positive voltage sweep setting it to a LRS again. The typical Vset and Vreset in the quasi-DC sweeps were about 0.65 and −1.10 V, respectively (FIG. 2B), and the test results indicate that the HRS and LRS resistances followed a narrow normal distribution.

The memristor device 120 can be switched reliably between the HRS and LRS states using 5 ns electrical pulses of 2.2 and −4 V pulse amplitude for SET and RESET, respectively. The resistance read at 0.1 V DC voltage after each switching event is plotted in FIG. 2C. The pulse switching results demonstrate that the hafnium oxide based memristor device 120 can be reversibly switched within 5 ns, and possibly faster. For the endurance measurement, 100 ns pulses were applied (see FIG. 2D, Vset=1.3 V, Vreset=−3.05 V, read at 0.1 V) and recorded over $1.2 \times 10^{11}$ open-loop switching cycles for the device without any feedback or power-limiting circuits. When compared to other known memristor devices, this is the highest reported endurance for a memristive device with a single layer of oxide as the switching material (i.e. $HfO_2$ layer 140).

The Ta/$HfO_2$/Pt memristor device 120 also showed excellent retention properties (FIG. 2E). The memristor device 120 retained its resistance states (both LRS and HRS) after over one month ($>2.7 \times 10^6$ s) without noticeable degradation at room temperature. To further evaluate the retention properties, temperature dependent measurements were carried out for the memristor device 120. FIG. 2F plots the device HRS failure time (t) as a function of temperature (T), which was $2.7 \times 10^5$, $7.5 \times 10^4$, $1.4 \times 10^4$, $2.7 \times 10^3$, and $1.3 \times 10^3$ s at 250, 275, 300, 325, and 350° C., respectively. The relation was well fitted by the Arrhenius equation (t∝exp($E_a$/kT)), where $E_a$ is the activation energy of mobile species and k the Boltzmann constant. The extrapolated retention time at 85° C. was $7 \times 10^4$ years, and it was beyond 10 years even at 162° C., suggesting that the Ta/$HfO_2$/Pt memristor device 120 may be used for non-volatile memory and data storage applications. It was also observed that the memristor device 120 has more reliable LRS retention than that of HRS. For example, the device abruptly changed from HRS to LRS after $1.4 \times 10^4$ s at 300° C., while staying at LRS without evident degradation even after $3 \times 10^4$ s. As a result, testing was focused on the retention properties of the memristor device at HRS. The testing results indicate that the longer retention time for the LRS was due to the fact that the conduction filament is relatively strong at LRS. The impressive retention performance indicates that the memristor device 120 fabricated according to the description herein produces a device with superior electrical performance characteristics.

Memristor device 120 is also capable of achieving multiple resistance states by using different compliance currents (CCs) and stop voltages during programming. With reference again to FIG. 3A, memristor device 120 was set to 24 different resistance levels with DC sweeps (0 to 1 to 0 V) by controlling the compliance currents starting from 100 μA to 3 mA. Memristor device 120 is not limited to a specific number of resistance levels, and fewer or more than 24 discrete resistance levels can be programmed, with 32 or even 64 or more resistance levels being possible. A current biasing circuit, such as a transistor based circuit, connected to the memristor device 120 may be used to control and set the compliance current during programming. A higher compliance current led to a lower resistance for the memristor device 120, which is consistent with previous observation that higher compliance currents contributed to the continuous growth of conduction channels. On the other hand, the memristor device 120 could be reset to different intermediate resistance levels with negative voltage sweeps of different stop voltages from −1.05 V with a step size of 0.05 V. Retention tests at 150° C. for the same device at 8 different resistance states (including the original HRS and 7 states that were achieved by using different compliance currents) showed that each state was stable even after $>10^4$ s, confirming the nonvolatile behavior and good retention properties. Precise tuning of the resistance into even more states can be implemented through a circuit with a one transistor-one memristor (1T1M) configuration, suggesting that memristor device 120 is suitable for use in multilevel non-volatile memories.

In addition to the multiple discrete levels, the resistance state of memristor device 120 can be tuned continuously using a train of electrical pulses, in a fashion that is similar to the potentiation and depression of biological synapses. The application of positive pulses on the top electrode (150) incrementally increases the device conductance, and the application of negative pulses on the top electrode (150) gradually decreases the conductance. FIG. 3C plots the conductance change of the memristor device 120 in response to 39 electric pulses of 100 ns. The amplitudes of the 26 consecutive positive pulses (potentiation 310) increased from 0.75 to 1 V, and those for the 13 consecutive negative voltages (depression 320) increased from −1.05 to −1.17 V, all with a 10 mV step size. Additionally, as shown in FIG. 3D, the cycling property of this analog conductance modulation behavior in the Ta/$HfO_2$/Pt memristor device 120 was tested, and over $2^{20}$ (>1 million) potentiation/depression epochs were successfully demonstrated. The reliable potentiation and depression behavior associated with memristor device 120 indicates that this device is also suitable for use as an electronic synapse for neuromorphic computing.

The switching characteristics of the Ta/$HfO_2$/Pt memristor device 120 are due to the composition modulation of a localized conduction channel(s) under electrical and thermal effects. As shown in FIG. 4A, both LRS and HRS have an almost linear I-V relation when read at low voltages, indicating the absence of a tunneling gap between the electrode and conduction channel or channels. As such, the switching cannot be attributed to the modulation of tunneling gap size as found in $TiO_x$ based devices. Furthermore, temperature-dependent conduction measurements were performed for both LRS and HRS states, and the measurement results are shown in FIG. 4B. In the LRS, the junction resistance increased linearly with temperature, a typical behavior for metallic materials. On the other hand, the HRS resistance changed in an opposite way and decreased with temperature, indicating a non-metallic conduction behavior. The temperature coefficient of resistance (TCR) was calculated to be $8.75 \times 10^{-4}$/K for LRS, and $-4.37 \times 10^{-4}$/K for HRS. The different signs of the TCR at LRS and HRS indicate the switching was caused by the modulation of the conduction channel composition, and not the size of the conduction channel. It should be noted that the TCR is independent of geometry. Additionally, testing and measurement results associated with the memristor device 120 show that the reactive metal electrode, specifically the tantalum top electrode 150, plays a more important role than expected in determining the device properties. Specifically, the superior performance characteristics achieved by the structure of memristor device 120 indicate that tantalum cations migrate into the hafnium oxide ($HfO_2$) layer and directly contribute to the formation of conduction channel(s) (i.e. conduction channel 510).

To verify the expected performance of memristor device 120, scanning transmission electron microscopy (STEM) and electron energy loss spectroscopy (EELS) analyses were conducted for the Ta/$HfO_2$/Pt memristor device 120 with a 3 μm diameter tantalum via as the top electrode 150. A thicker 10 nm hafnium oxide ($HfO_2$) layer 140 was used to provide sufficient material volume for a better TEM characterization. The memristor device 120 was repeatedly switched for several cycles and left at LRS before being cut using a focus ion beam (FIB) microscope. During the resistance switching cycles, a small part of the memristor device 120 was deformed because of Joule heating and the evolution of compressed oxygen bubble, consistent with previous results. As is generally accepted, conduction channels typically surround the deformation sites. Thus the deformation site in the memristor device 120 fabricated for testing was used to identify the position of conduction channel(s) during FIB cutting. FIG. 5A shows a typical high-angle annular dark field (HAADF)-STEM image 500 of a conduction channel 510 connecting the tantalum top electrode (150) and the platinum bottom electrode (130). The cone-shaped conduction channel 510 has a diameter of 10 nm at the tantalum top electrode (150) end and 6 nm near the platinum bottom electrode (130). In addition, some incomplete tantalum-rich channels 520 were also found in the same device that did not reach to the platinum bottom electrode (130). With continued reference to FIG. 5A, it is noticeable that the conduction channel 510 shown in image 500 is brighter than the surrounding oxide, which means it is composed of heavier atoms (i.e., tantalum in the device) because the image intensity in the STEM mode is proportional to $Z^{1.7}$ (Z is the atomic number of the species) and the atomic density. Typical core-loss EELS spectrum taken at the unchanged hafnium oxide ($HfO_2$) layer 140 has a dominant Hf-M edge peak at (1716 eV) while that from the tantalum electrode 150 has a typical Ta-M edge peak at (1797 eV) (see FIG. 5B). The EELS spectrum from the conduction channel 510 shows an evident peak of Ta-M edge while only a small bump near Hf-M edge, indicating that the conduction channel 510 is tantalum-rich. This observation agrees well with the intensity contrast of the HAADF-STEM image 500 shown in FIG. 5A. Similarly, O-K edge EELS spectra from those three positions clearly reveal the decreased oxygen intensity within the conduction channel (see FIG. 5C). Core-loss EELS mapping results further confirm the conduction channel 510 is tantalum-rich and oxygen-deficient. The contribution of tantalum migration to the formation of conduction channels is in line with STM studies, and the experimental results described herein indicate that the migration of tantalum cations is caused by the electric field and Joule heating.

Based on the electrical measurements and physical characterization, the switching mechanism of the Ta/$HfO_2$/Pt memristor device 120 can be explained as follows. During the forming step, tantalum is oxidized into $Ta^{x+}$ when a positive voltage is applied on the taltalum top electrode 150. Due to the strong electric field and concentration gradient, the mobile $Ta^{x+}$ cations migrate into the hafnium oxide ($HfO_2$) layer 140 and serve as dopants. In the meantime, $O^{2-}$ anions are attracted towards the tantalum top electrode 150, which introduces oxygen vacancies ($V_O$s) as dopants in the oxide layer. This is similar to the well-studied tantalum anodizing process, in which case the tantalum oxide growth on the surface is attributed to both the inward migration of oxygen anions to the metal/oxide interface and the outward migration of tantalum cations to the oxide/solution interface. The simultaneous movement of both ions is attributed to their comparable mobility and hence similar migration barrier (0.047 eV difference between tantalum cations and oxygen anions) within the hafnium oxide ($HfO_2$). The continuous migration of $Ta^{x+}$ into and $O^{2-}$ out of the $HfO_2$ layer increases the doping levels of tantalum and $V_O$ to the $HfO_2$ layer and finally form localized conduction channel(s), bringing the device to LRS. In the first RESET process, a negative bias is applied at the tantalum top electrode 150. In the vertical direction (perpendicular to the electrode/oxide interfaces), electric field drives oxygen anions toward the platinum bottom electrode 130 which pulls tantalum cations back toward the tantalum top electrode 150. The motion of both ions leads to lower tantalum but higher oxygen concentrations in the conduction channel 510, and hence a more resistive device that is at HRS. On the other hand, a positive voltage during the first SET process reverses the process and turns the memristor device 120 back to LRS. It is worth noting that although it is easier to understand the channel composition modulation through the electric field induced vertical drift, thermally enhanced lateral diffusion also plays an important role for the device operation. As a result, the resistive switching in the Ta/$HfO_2$/Pt memristor device 120 can be attributed to the growth and reoxidation of Ta-rich and O-deficient conduction channel(s) through motions of Ta cations and O anions. The resulting operation of the memristor device 120 is very different from previously popular switching mechanism for hafnium oxide ($HfO_2$) based devices, in which only O anions at the electrode/oxide interface contribute to the switching while the electrodes (e.g., Ta, Ti, and Hf) only serve as the oxygen gettering layer. On the other hand, the Ta-rich conduction channel 510 in the hafnium oxide memristor device 120 leads to similar switching behaviors (such as long retention and high endurance) as those found in prior $TaO_x$ based memristive devices. The amorphous structure of the conduction channel(s) 510 facilitates ion motion and exchanging during the resistive switching process, contributing to the superior endurance and fast switching speed, while the continuous modulation of the channel composition leads to the multiple resistance states of the memristor device 120. The competition between drift and diffusion is believed to be responsible for the observed analog switching behavior. The testing and measurement results indicate that the long retention of the memristor device 120 can be attributed to the large diffusion barriers (1.55 eV, See FIG. 2F) of the mobile ions.

Finally, although migration of tantalum cations was directly observed, the co-existence of oxygen anion movement makes the memristor device 120 fundamentally different from traditional ECM devices based on motion of silver (Ag) or copper (Cu) ions. The difference is a result from a number of reasons. First, tantalum is more easily oxidized than silver due to the much stronger negative Gibbs energy for the formation of oxides ($Ta_2O_5$: −760 kJ $mol^{-1}$ and $Ag_2O$: −60 kJ $mol^{-1}$). Consequently, the motion of oxygen anions facilitates the oxidation of tantalum and contributes to the modulation of device resistances. On the contrary, metallic filaments of silver or copper can stably exist within the oxide layer. Second, there is a big difference in the migration barriers between silver and oxygen (1.19 eV for Ag and 1.52 eV for 0 anions in $TaO_x$) while that between tantalum and oxygen is very small. As a result, motion of silver or copper ions is more preferable than oxygen anions in ECM devices. The transition from VCM- to ECM-type switching behaviors in typical VCM material system (Ta/$TaO_x$/Pt) has been achieved by inserting a thin amorphous carbon layer at the Ta/$TaO_x$ interface or using highly reduced $TaO_x$ to suppress the role of oxygen anions.

With reference to the various performance tests described herein, the The DC electrical characterizations were carried out with an Agilent 4156B semiconductor parameter analyzer in a voltage-sweep mode. Pulse measurements for switching speed, cycling endurance and analog switching were conducted with an Agilent 81160a pulse generator. The devices were programmed to ON or OFF states and the resistance was read at 100 mV DC voltage between switching events. The retention tests at 250, 275 and 300° C. were performed on a Cascade Summit 11000 probe system equipped with a thermal chuck (ambient to 300° C., 0.1° C. accuracy). The retention performances at 325 and 350° C. were measured in a variable temperature micro probe system (MMR Technology) (70 to 730 K, ±0.1 K accuracy). The device resistances were periodically monitored by an Agilent B1500 at different temperatures in every 60 s with a low read voltage (0.1 V, ~20 ms) to avoid disturbance of the device states. For all the electrical measurements, the bottom electrodes (130) were grounded while the top electrodes (150) were biased.

With reference to the various physical characterization analyses described herein, the HAADF-STEM images, and EELS analysis were acquired in an aberration-corrected Hitachi HD2700C Scanning Transmission Electron Microscope operated at 200 keV. The focus ion beam (FIB) cut TEM cross-section samples were prepared with a FEI Helios 600 nanoLab.

Although a few implementations have been described in detail above, other modifications are possible. In addition, other components may be added to, or removed from, the described memristor device. Accordingly, other implementations are within the scope of the following claims.

What is claimed is:

1. A memristor device comprising:
a substrate;
a platinum bottom electrode formed on the substrate;
a tantalum top electrode formed opposite the bottom electrode;
an electrical insulator layer disposed between the top electrode and the bottom electrode, the electrical insulator layer comprising hafnium oxide; and
a conduction channel comprising tantalum and oxygen through the electrical insulator layer between the tantalum top electrode and the platinum bottom electrode,
wherein relative concentrations of tantalum and oxygen in the conduction channel are modulated by varying a level of a voltage applied to the tantalum top electrode.

2. The device of claim 1, wherein the conduction channel is tantalum rich and oxygen deficient.

3. The device of claim 1 wherein the memristor device is settable at multiple discrete resistance levels.

4. The device of claim 3 wherein the multiple discrete resistance levels are set using a current biasing circuit connected to the memristor device.

5. The device of claim 3 wherein the multiple discrete resistance levels include a range of 2 to 64 discrete resistance levels.

6. The device of claim 4 wherein the current biasing circuit comprises a transistor circuit connected to the memristor device.

7. The device of claim 1 wherein the platinum bottom electrode is formed to have a thickness of 20 nanometers.

8. The device of claim 1 wherein the platinum bottom electrode is formed to have a thickness in a range of 2 to 200 nanometers.

9. The device of claim 1 wherein the tantalum top electrode is formed to have a thickness of 50 nanometers.

10. The device of claim 1 wherein the tantalum top electrode is formed to have a thickness in a range of 2 to 200 nanometers.

11. The device of claim 1 wherein the electrical insulator layer is formed to have a thickness of 5 nanometers.

12. The device of claim 1 wherein the electrical insulator layer is formed to have a thickness in a range of 2 to 20 nanometers.

13. The device of claim 1 further comprising:
an oxide layer formed on a top surface of the substrate; and
a titanium layer formed on the oxide layer, wherein the platinum bottom electrode is formed on the titanium layer.

14. The device of claim 13 wherein the oxide layer is silicon oxide.

15. The device of claim 1, wherein the memristor device can be tuned continuously on a resistance scale by varying the level of the voltage applied to the tantalum top electrode.

16. The memristor device of claim 1, wherein the electrical insulator layer is a blanket electrical insulator layer fabricated using an atomic layer deposition process.

17. The memristor device of claim 1, wherein the conduction channel has a cone shape, with a first diameter adjacent to the tantalum top electrode being greater than a second diameter adjacent to the platinum bottom electrode.

18. A memristor device comprising:
a substrate;
a bottom electrode formed on the substrate;
a tantalum top electrode formed opposite the bottom electrode;
an electrical insulator layer disposed between the tantalum top electrode and the bottom electrode, the electrical insulator layer comprising hafnium oxide; and
a conduction channel comprising tantalum and oxygen through the electrical insulator layer between the tantalum top electrode and the bottom electrode,
wherein relative concentrations of tantalum and oxygen in the conduction channel are modulated by varying a level of a voltage applied to the tantalum top electrode.

19. The device of claim 18 wherein the bottom electrode comprises a platinum layer.

20. The device of claim 18 wherein a titanium nitride (TiN) layer is formed on the substrate and the bottom electrode further comprises a layer of an inert metal formed on the titanium nitride (TiN) layer.

21. The device of claim 20 wherein the layer of the inert metal is formed to have a thickness of 1-4 nanometers.

22. The device of claim 21 wherein the titanium nitride layer is formed to have a thickness of 20 nanometers.

23. The device of claim 20, wherein the inert metal includes platinum (Pt).

24. A memristor device comprising:
a substrate;

a silicon oxide layer formed on the substrate;
a metal adhesion layer formed on the silicon oxide layer, the metal adhesion layer comprising one of a titanium adhesion layer and a titanium nitride adhesion layer;
a bottom electrode comprising an inert metal formed on the metal adhesion layer, the bottom electrode formed to have a thickness in a range of 2 to 200 nanometers;
an electrical insulator layer formed on the bottom electrode, the electrical insulator layer comprising hafnium oxide and formed to have a thickness of 5 nanometers;
a tantalum top electrode formed on the electrical insulator layer, the tantalum top electrode formed to have a thickness of 50 nanometers; and
a conduction channel comprising tantalum and oxygen through the electrical insulator layer between the tantalum top electrode and the bottom electrode,
wherein relative concentrations of tantalum and oxygen in the conduction channel are modulated by varying a level of a voltage applied to the tantalum top electrode.

25. The device of claim 24, wherein the conduction channel is tantalum rich and oxygen deficient.

26. The device of claim 24, wherein the inert metal includes platinum (Pt).

27. A memristor device comprising:
a substrate;
a bottom electrode comprising a first metal formed on the substrate;
a top electrode comprising a second metal formed opposite the bottom electrode;
an electrical insulator layer disposed between the top electrode and the bottom electrode, the electrical insulator layer comprising a metal oxide, wherein a metal in the metal oxide is different from the first metal or the second metal; and
a conduction channel comprising the second metal and oxygen through the electrical insulator layer between the top electrode and the bottom electrode,
wherein relative concentrations of the second metal and oxygen in the conduction channel are modulated by varying a level of a voltage applied to the top electrode.

* * * * *